United States Patent
Oshima et al.

(10) Patent No.: US 7,118,934 B2
(45) Date of Patent: Oct. 10, 2006

(54) POROUS SUBSTRATE FOR EPITAXIAL GROWTH, METHOD FOR MANUFACTURING SAME, AND METHOD FOR MANUFACTURING III-NITRIDE SEMICONDUCTOR SUBSTRATE

(75) Inventors: Yuichi Oshima, Tokyo (JP); Masatomo Shibata, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 233 days.

(21) Appl. No.: 10/821,921

(22) Filed: Apr. 12, 2004

(65) Prior Publication Data
US 2004/0206967 A1    Oct. 21, 2004

(30) Foreign Application Priority Data
Apr. 15, 2003   (JP)   ............... 2003-110726

(51) Int. Cl.
  H01L 21/00   (2006.01)
  H01L 31/0328  (2006.01)
  H01L 29/00   (2006.01)

(52) U.S. Cl. ............... 438/48; 148/33; 257/189
(58) Field of Classification Search .......... 438/48; 257/189; 148/33
See application file for complete search history.

(56) References Cited

U.S. PATENT DOCUMENTS 6,555,845 B1   4/2003  Sunakawa et al.
2002/0197825 A1   12/2002 Usui et al.
2006/0046511 A1*  3/2006  Shibata et al. ............ 438/767
2006/0102929 A1*  5/2006  Okamoto et al. ........... 257/189

FOREIGN PATENT DOCUMENTS

| JP | 63-188983 A | 8/1988 |
| JP | 10-312971 A | 11/1998 |
| JP | 2003-178984 A | 6/2003 |

OTHER PUBLICATIONS

Ok-Hyun Nam et al., "Lateral Epitaxy of Low Defect Density GaN Layers via Organometallic Vapor Phase Epitaxy", Appl. Phys. Lett. 71 (18), Nov. 3, 1997, pp. 2638-2640.

M. Kuramoto et al., "Room-Temperature Continuous-Wave Operation of InGaN Multi-Quantum-Well Laser Diodes Grown on an n-GaN Substrate with a Backside n-Contact", Jpn. J. Appl. Phys., vol. 38, (1999), pp. L184-L186.

T. Zheleva et al., "Pendeo-Epitaxy—A New Approach for Lateral Growth of Gallium Nitride Structures", MRS Internet J. Nitride Semicond, Res. 4S1, G3.38 (1999), 3 pages.

* cited by examiner

*Primary Examiner*—David S. Blum
(74) *Attorney, Agent, or Firm*—Foley & Lardner LLP

(57) ABSTRACT

A porous substrate for epitaxial growth includes an underlying layer made of III-nitride semiconductor which is grown on a sapphire substrate, a void-formation preventive layer which is grown on the underlying layer, a porous III-nitride semiconductor layer and a porous metallic layer on the porous III-nitride semiconductor layer.

35 Claims, 5 Drawing Sheets

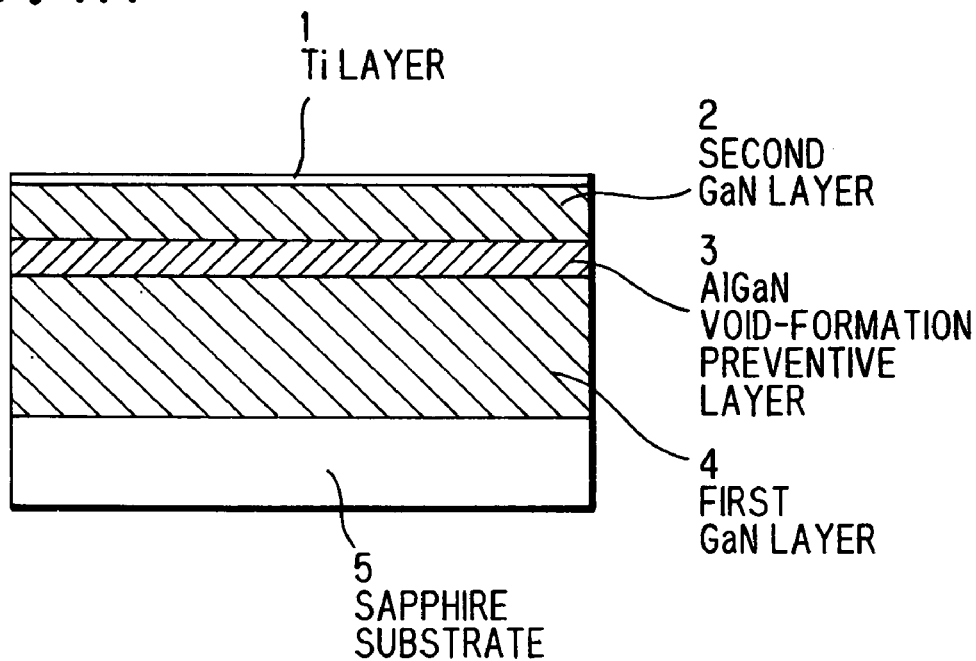
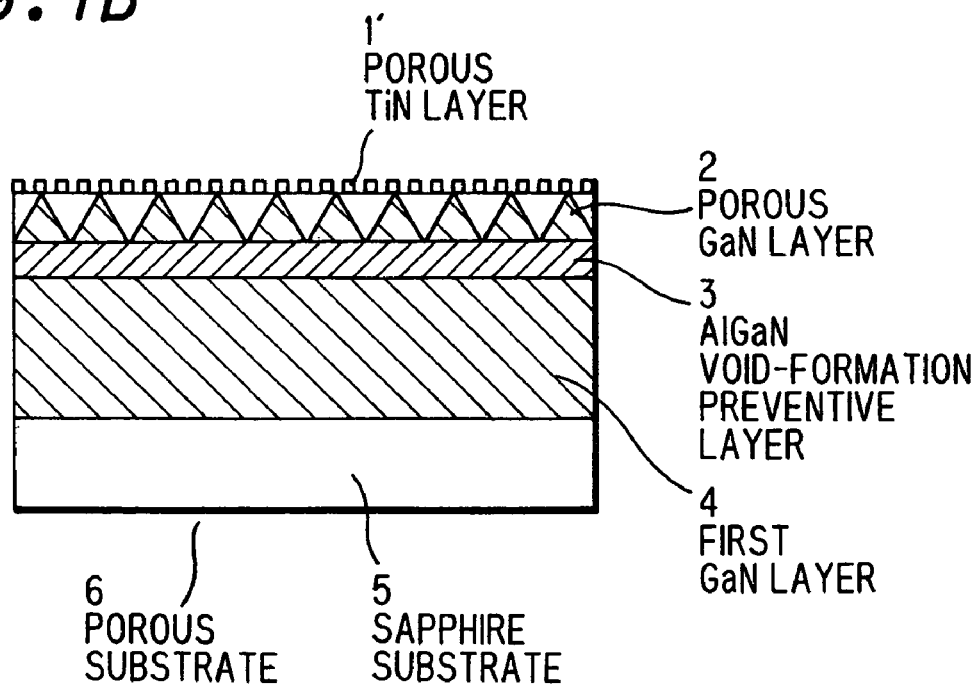

7 HVPE-GaN LAYER
1' POROUS TiN LAYER
2' POROUS GaN LAYER
3 AlGaN VOID-FORMATION PREVENTIVE LAYER
4 FIRST GaN LAYER
5 SAPPHIRE
6 POROUS SUBSTRATE

7' GaN FREE-STANDING SUBSTRATE

POROUS SUBSTRATE FOR EPITAXIAL GROWTH, METHOD FOR MANUFACTURING SAME, AND METHOD FOR MANUFACTURING III-NITRIDE SEMICONDUCTOR SUBSTRATE

The present application is based on Japanese patent application No. 2003-110726, the entire contents of which are incorporated herein by reference.

BACKGROUND OF THE INVENTION

1. Field of the Invention

The present invention relates to a porous substrate for epitaxial growth, a method for manufacturing the same, and a method for manufacturing III-nitride semiconductor substrate, and particularly to a porous substrate for epitaxial growth by which III-nitride semiconductor substrate having a low defect density can be epitaxially grown in good reproducibility, a method for manufacturing the same, and a method for manufacturing III-nitride semiconductor substrate.

2. Description of the Related Art

GaN compound semiconductors such as gallium nitride (GaN), indium gallium nitride (InGaN), and gallium aluminum nitride (GaAlN) are significantly watched as materials for optical device such as blue light emitting diode (LED), and laser diode (LD). In addition, since GaN compound semiconductors are excellent in heat resistance and environmental resistance, a development for applying the GaN compound semiconductors having such remarkable characteristic features to elements for electronic device is started.

Bulk crystal growth of GaN compound semiconductors is difficult. In this connection, a GaN free-standing substrate which can be served for practical use is in the midway of development. At present, sapphire is widely used for a substrate for GaN growth. A method for epitaxially growing GaN on a monocrystalline sapphire substrate by means of metal organic vapor phase epitaxy (MOVPE) technique or the like is commonly used.

However, since a sapphire substrate has a different lattice constant from that of GaN, a monocrystalline film cannot be grown, when the GaN is directly grown on the sapphire substrate. For this reason, there is proposed a method wherein an AlN or GaN buffer layer is once grown on a sapphire substrate at a low temperature to moderate distortion in lattice by means of the low-temperature growth buffer layer, and then GaN is grown thereon (for example, Japanese patent application laid-open No. 1988-188983). When such a low-temperature growth nitride is used as a buffer layer, monocrystalline epitaxial growth of GaN is possible. In even this method, however, a discrepancy in lattices of the substrate and the crystal is a problem. The resulting GaN has a dislocation density of $10^9$ to $10^{10}$ cm$^{-2}$. This defect is an obstacle in manufacturing GaN LDs.

Growth techniques such as ELO [Appln. Phys. Lett. 71 (18), (1997), pp 2638 to 2640], FIERO [Jpn. J. Appln. Phys. Vol. 38 (1999), pp L184 to L186], and pendeo-epitaxy [MRS Internet J. Nitride Semicond. Res. 4S1, G3. 38 (1999)] are reported as a method for reducing defect density resulted from a difference in lattice constants of sapphire and GaN. These growth techniques are such that a mask which is patterned with SiO$_2$ or the like is grown on GaN grown on a sapphire or the like substrate, GaN crystal is selectively grown further through window openings of the mask to cover the mask with the GaN by means of lateral growth, whereby propagation of dislocation from underlying crystal is prevented. Because of a development of such growth techniques, it becomes possible to reduce remarkably a dislocation density in GaN to an order of around $10^7$ cm$^{-2}$. An example of the techniques is disclosed in Japanese patent application laid-open No. 1998-312971

Although GaN crystal having a low dislocation density can be obtained in accordance with these ELO techniques, the GaN crystal is grown on a heterogeneous substrate such as sapphire. Accordingly, a method for removing such heterogeneous substrate is required separately to obtain a free-standing substrate.

As a simple method for removing a heterogeneous substrate, the present applicant has proposed an exfoliation method by void formation wherein a Ti thin film is grown on a sapphire substrate on the surface of which a thin GaN layer is grown, the resulting sapphire substrate is heat-treated in a mixed gas stream of, for example, hydrogen and ammonia to obtain a porous substrate containing voids, a thick GaN film is grown on the porous substrate, and after the growth, the thick GaN film is easily exfoliated from the substrate by means of behavior of voids in the growth interface (Japanese patent application No. 2001-090148).

In the above-described exfoliation method by void formation, a flat GaN layer having thin thickness of around 300 to 500 nm is desirable. When a thick GaN layer is used, voids to be formed in the layer become very deep, so that another thick GaN film to be grown thereon is difficult to obtain a mirror surface and to achieve exfoliation.

On the other hand, it is not so easy to grow a thin and flat GaN layer on a sapphire substrate in good reproducibility. Even a slight change in a condition of a growth furnace, by which though growth in a comparatively thick film is scarcely affected adversely, influences remarkably a state of crystal in a thin film, resulting in difficulty to make the surface of the film flat. Accordingly, there is such a problem that a growth condition must be checked each time. Even if there is a flat appearance, unevenness in crystallinity is significant, so that a heat-treating condition to form voids is not constant, resulting in necessity for checking the heat-treating condition each time.

SUMMARY OF THE INVENTION

Accordingly, it is an object of the present invention to solve the above-described problems, and to provide a porous substrate for epitaxial growth by which III-nitride semiconductor substrate having a low dislocation density can be epitaxially grown in good reproducibility, a method for manufacturing the same, and a method for manufacturing III-nitride semiconductor substrate.

In order to achieve the above-described object, the present invention provides a porous substrate for epitaxial growth comprising an underlying layer made of III-nitride semiconductor, a void-formation preventive layer grown on the underlying layer, a porous III-nitride semiconductor layer and a porous metallic layer grown on the porous III-nitride semiconductor layer.

In the above-described exfoliation method by void formation, a porous substrate which is prepared by growing a metallic layer having a number of micropores (for example, porous TiN layer) on the surface of a porous III-nitride semiconductor layer (for example, a porous GaN layer) is used for a substrate for growing III-nitride semiconductor (for example, GaN) thick film. The porous substrate is obtained, for example, by evaporating Ti on the surface of a GaN epitaxial layer grown on a sapphire substrate, and then, heat-treating the resulting substrate in a mixed gas of hydrogen and ammonia. In this processing, since a number of voids are formed in the GaN epitaxial layer, the substrate is called by the name of porous substrate.

As a result of a variety of studies, the present inventors have found that too deep voids in a GaN layer of a porous substrate results in difficulty to flatten the surface of growth crystal. In other words, the thinner GaN layer brings about the better result for flattening crystal growth. However, it is not easy to grow homogeneously such thin and flat GaN layer, and pits are formed due to belated flattening. Even if a flattened surface is obtained, a distribution of film thickness becomes liable to be high. Even when an ideal growing condition was once found, such condition is not assured dependent upon changes in a condition of a growth device, so that it is not easy to establish good reproducibility. Moreover, there is such a problem that since a thin GaN layer contains many dislocations, a layer to be grown thereon is liable to have a high dislocation density and remarkable warp.

In order to solve such problems, III-nitride semiconductor layer (for example, a first GaN layer) is grown first in a thick thickness of around 1 μm to 3 μm, as an underlying layer, on a base material such as sapphire and the like in the present invention. In such a thick layer, a flat crystal can be grown in good reproducibility. Then, an insertion layer (for example, an AlGaN layer) of around 3 nm to 1 μm is grown on the underlying layer, and another III-nitride semiconductor layer (for example, a second GaN layer) of around 300 μm is grown on the resulting substrate. The flat and uniform insertion layer and the second GaN layer can be easily grown on the thick and uniform first GaN layer. Ti is evaporated on the resulting substrate having three-layered structure, and when the Ti-evaporated substrate is heat-treated, many voids are formed in the second GaN layer, while the insertion layer which is more hardly etched than the GaN layer functions as a void-formation preventive layer, and formation of voids is prevented by the preventive layer. Accordingly, no more deeper voids appear. As a result, it becomes possible to form a thin and homogeneous void layer in good reproducibility.

According to the present invention, a porous substrate for epitaxial growth comprises an underlying layer made of III-nitride semiconductor, a void-formation preventive layer grown on the underlying layer, a porous III-nitride semiconductor layer, and a porous metallic layer grown on the porous III-nitride semiconductor layer.

In the porous substrate for epitaxial growth according to the invention, the underlying layer made of III-nitride semiconductor is a GaN free-standing substrate.

In the porous substrate for epitaxial growth according to the invention, the underlying layer made of III-nitride semiconductor is grown on a base material.

In the porous substrate for epitaxial growth according to the invention, a thickness of the underlying layer made of III-nitride semiconductor is 300 nm or more.

In the porous substrate for epitaxial growth according to the invention, the base material is prepared from at least one material selected from the group consisting of sapphire, silicon, silicon carbide, langasite, zirconium diboride, and gallium arsenide.

In the porous substrate for epitaxial growth according to the invention, the III-nitride semiconductor is prepared from at least one material selected from the group consisting of GaN, AlGaN, InGaN, and InAlGaN.

In the porous substrate for epitaxial growth according to the invention, the void-formation preventive layer has less than 6% lattice constant difference with respect to that of the III-nitride semiconductor.

In the porous substrate for epitaxial growth according to the invention, the void-formation preventive layer is prepared from AlGaN.

In the porous substrate for epitaxial growth according to the invention, the void-formation preventive layer is a superlattice structure composed of alternately grown plural pairs of an $Al_xGa_{1-x}N$ ($0<x\leq0.5$) layer and an $Al_yGa_{1-y}N$ ($0\leq y<x$) layer.

In the porous substrate for epitaxial growth according to the invention, the void-formation preventive layer has 3 nm or more thickness.

In the porous substrate for epitaxial growth according to the invention, the porous III-nitride semiconductor layer has 3 μm or less thickness.

In the porous substrate for epitaxial growth according to the invention, the porous metallic layer is prepared from at least one material selected from the group consisting of titanium, vanadium, chromium, manganese, iron, cobalt, nickel, copper, yttrium, zirconium, niobium, molybdenum, tellurium, ruthenium, rhodium, palladium, hafnium, tantalum, tungsten, rhenium, osmium, iridium, platinum, and gold, or the nitrides thereof.

A porous substrate for epitaxial growth according to the present invention comprises a sapphire substrate, a GaN layer grown on the sapphire substrate, an AlGaN layer grown on the GaN layer, a porous GaN layer grown on the AlGaN layer, and a porous TiN layer.

A method for manufacturing a porous substrate for epitaxial growth according to the present invention comprises the steps of growing a void-formation preventive layer on an underlying layer made of III-nitride semiconductor, growing III-nitride semiconductor layer on the void-formation preventive layer, growing a metallic layer on the III-nitride semiconductor layer, and forming voids in the III-nitride semiconductor layer and the metallic layer grown on the void-formation preventive layer.

In the method for manufacturing a porous substrate for epitaxial growth according to the invention, the underlying layer prepared from the III-nitride semiconductor is a GaN free-standing substrate.

The method for manufacturing a porous substrate for epitaxial growth according to the invention comprises further the step of growing the underlying layer made of the III-nitride semiconductor on the base material.

In the method for manufacturing a porous substrate for epitaxial growth according to the invention, the base material is prepared from at least one material selected from the group consisting of sapphire, silicon, silicon carbide, langasite, zirconium diboride, and gallium arsenide.

In the method for manufacturing a porous substrate for epitaxial growth according to the invention, the III-nitride semiconductor is prepared from at least one material selected from the group consisting of GaN, AlGaN, InGaN, and InAlGaN.

In the method for manufacturing a porous substrate for epitaxial growth according to the invention, the void-formation preventive layer is made of AlGaN or a metallic nitride having a lattice constant close to that of AlGaN or the III-nitride semiconductor.

In the method for manufacturing a porous substrate for epitaxial growth according to the invention, the void-formation preventive layer is a superlattice structure composed of alternately grown plural pairs of an $Al_xGa_{1-x}N$ ($0<x\leqq0.5$) layer and an $Al_yGa_{1-y}N$ ($0\leqq y<x$) layer.

In the method for manufacturing a porous substrate for epitaxial growth according to the invention, the metallic porous layer is made of at least one material selected from the group consisting of titanium, vanadium, chromium, manganese, iron, cobalt, nickel, copper, yttrium, zirconium, niobium, molybdenum, tellurium, ruthenium, rhodium, palladium, hafnium, tantalum, tungsten, rhenium, osmium, iridium, platinum, and gold, or the nitrides thereof.

The method for manufacturing a porous substrate for epitaxial growth according to the invention comprises further the step of forming voids in the III-nitride semiconductor layer and the metallic layer grown on the void-formation preventive layer by means of the heat treatment.

In the method for manufacturing a porous substrate for epitaxial growth according to the invention, the heat treatment is implemented in an atmosphere containing hydrogen gas or a hydride gas.

A method for manufacturing a porous substrate for epitaxial growth according to the present invention comprises the steps of growing a first GaN layer on a sapphire substrate, growing an AlGaN layer on the first GaN layer, growing a second GaN layer on the AlGaN layer, growing a Ti layer on the second GaN layer, and heat-treating the second GaN layer and the Ti layer in a mixed gas atmosphere of hydrogen gas and a hydride gas to form voids in the second GaN layer and the Ti layer.

A method for manufacturing III-nitride semiconductor substrate according to the present invention comprises the steps of growing a void-formation preventive layer on an underlying layer made of III-nitride semiconductor, growing III-nitride semiconductor layer on the void-formation preventive layer, growing a metallic layer on the III-nitride semiconductor layer, forming voids in the III-nitride semiconductor layer and the metallic layer grown on the void-formation preventive layer, epitaxially growing III-nitride semiconductor on the metallic layer in which voids are formed, and exfoliating the III-nitride semiconductor substrate after the epitaxial growth thereof from the metallic layer.

In the method for manufacturing III-nitride semiconductor substrate according to the invention, the underlying layer made of the III-nitride semiconductor is a GaN free-standing substrate.

The method for manufacturing III-nitride semiconductor substrate according to the invention comprises further the step of growing the underlying layer made of the III-nitride semiconductor on the base material.

In the method for manufacturing III-nitride semiconductor substrate according to the invention, the base material is prepared from at least one material selected from the group consisting of sapphire, silicon, silicon carbide, langasite, zirconium diboride, and gallium arsenide.

In the method for manufacturing III-nitride semiconductor substrate according to the invention, the III-nitride semiconductor is prepared from at least one material selected from the group consisting of GaN, AlGaN, InGaN, and InAlGaN.

In the method for manufacturing III-nitride semiconductor substrate according to the invention, the void-formation preventive layer is made of AlGaN or a metallic nitride having a lattice constant close to that of the III-nitride semiconductor.

In the method for manufacturing III-nitride semiconductor substrate according to the invention, the void-formation preventive layer is a superlattice structure composed of alternately grown plural pairs of an $Al_xGa_{1-x}N$ ($0<x\leqq0.5$) layer and an $Al_yGa_{1-y}N$ ($0\leqq y<x$) layer.

In the method for manufacturing III-nitride semiconductor substrate according to the invention, the metallic porous layer is made of at least one material selected from the group consisting of titanium, vanadium, chromium, manganese, iron, cobalt, nickel, copper, yttrium, zirconium, niobium, molybdenum, tellurium, ruthenium, rhodium, palladium, hafnium, tantalum, tungsten, rhenium, osmium, iridium, platinum, and gold, or the nitrides thereof.

The method for manufacturing III-nitride semiconductor substrate according to the invention comprises further the step of forming voids in the III-nitride semiconductor layer and the metallic layer grown on the void-formation preventive layer by means of the heat treatment.

In the method for manufacturing III-nitride semiconductor substrate according to the invention, the heat treatment is implemented in an atmosphere containing hydrogen gas or a hydride gas.

A method for manufacturing III-nitride semiconductor substrate according to the present invention comprises the steps of growing a first GaN layer on a sapphire substrate, growing an AlGaN layer on the first GaN layer, growing a second GaN layer on the AlGaN layer, growing a Ti layer on the second GaN layer, and heat-treating the second GaN layer and the Ti layer in a mixed gas atmosphere of hydrogen gas and a hydride gas to form voids in the second GaN layer and the Ti layer, epitaxially growing a GaN on the Ti layer in which voids are formed, and exfoliating the GaN substrate after the epitaxial growth thereof from the Ti layer.

BRIEF DESCRIPTION OF THE DRAWINGS

The present invention will be explained in more detail in conjunction with appended drawings, wherein:

FIG. 1A is an explanatory view of an embodiment of the present invention illustrating processes for embodying example 1;

FIG. 1B is an explanatory view of the embodiment of the present invention illustrating the resulting porous substrate according to the example 1;

DESCRIPTION OF THE PREFERRED EMBODIMENTS

Figure 2A:
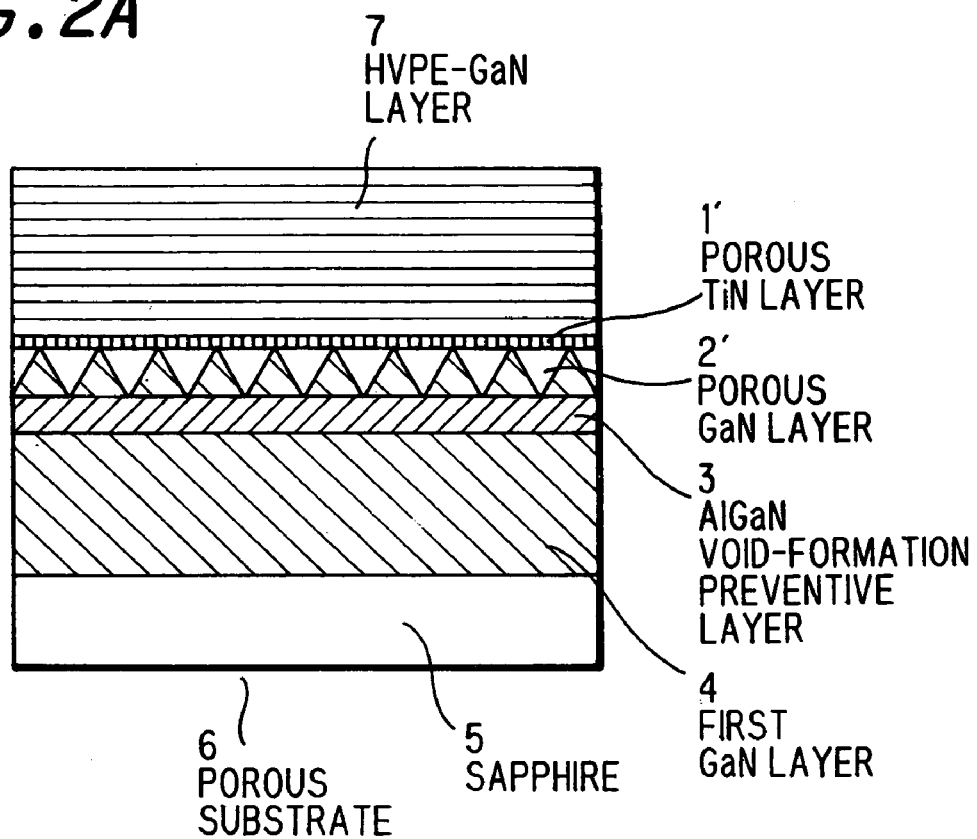
FIG. 2A is an explanatory view of the embodiment of the present invention illustrating processes for embodying example 2.

A preferred embodiment of the present invention will be described in detail hereinafter by referring to the accompanying drawings.

In the present invention, an example of III-nitride semiconductor for preparing an underlying layer includes GaN, AlGaN, InGaN, InAlGaN and the like. III-nitride semiconductor free-standing substrate may be used for the underlying layer. Furthermore, III-nitride semiconductor layer is grown on a substrate material of sapphire, silicon, SiC, langasite, zirconium diboride, GaAs and the like, and the resulting material may also be used for the underlying layer. It is preferred that a thickness of III-nitride semiconductor layer to be used for the underlying layer is 300 nm or more, and 1 μm or thicker is more preferable. When such thickness is achieved, dislocation of a porous III-nitride semiconductor layer can be decreased, resulting in decrease in dislocation of a thick III-nitride semiconductor substrate to be grown on the porous III-nitride semiconductor layer, so that warp can be suppressed. The upper limit of thickness is not specified, but 3 μm or less is preferred in view of efficiency of manufacture, cost and the like.

HVPE (Hydride Vapor Phase Epitaxy) technique is preferable for epitaxial technique of III-nitride semiconductor layer. This is because crystal epitaxy rate is high, and a thick film is easily obtained. However, different technique such as MOVPE (Metalorganic Vapor Phase Epitaxy) technique may be applied. Besides, a combination of plural epitaxial techniques wherein such III-nitride semiconductor is subjected roughly to MOVPE epitaxial technique, and then a GaN film is made thicker in accordance with HVPE technique, or the like combined techniques may also be applied.

It is preferred that a void-formation preventive layer to be grown on an underlying layer has a difference of lattice constant between that of the above or the underneath III-nitride semiconductor is less than 6%. In this respect, when the difference of lattice constant exceeds 6%, a possibility of further appearance of dislocation becomes remarkable. An example of a suitable material for the preventive layer includes AlGaN. A thickness of the void-formation preventive layer is preferably 3 nm or more. When it is less than 3 nm, effect for preventing void formation is insufficient, and there is such a fear that voids penetrate up to the underlying layer.

An example of the III-nitride semiconductor to be used for growing a porous III-nitride semiconductor layer includes GaN, AlGaN, InGaN, InAlGaN and the like as in the case of the III-nitride semiconductor to be used for growing an underlying layer. The porous III-nitride semiconductor layer is obtained by such a manner that the III-nitride semiconductor layer and a metallic layer are sequentially grown on a void-formation preventive layer, and when heat-treatment is applied thereto, voids appear inside the porous III-nitride semiconductor layer. It is desirable that the porous III-nitride semiconductor layer is flat and its thickness is less than 3 μm. When the layer is not flat, a metallic layer is broken at the time when a metal is evaporated on the layer and heat-treated. As a result, an effect, as a nanomask, for suppressing propagation of dislocation becomes hindered. On the contrary, when the thickness is 3 μm or thicker, voids each having a deep depth appear, and it is difficult to flatten the III-nitride semiconductor layer to be grown thereon. On one hand, when the thickness is as thin as less than 20 nm, it is difficult to control void ratio, resulting in a problem in exfoliation of the III-nitride semiconductor layer.

A porous metallic layer is obtained by such a manner that a metallic layer of titanium, nickel, tantalum, tungsten or the like is disposed on the III-nitride semiconductor layer, and they are heat-treated. The metallic layer is formed from at least one material selected from the group consisting of titanium, vanadium, chromium, manganese, iron, cobalt, nickel, copper, yttrium, zirconium, niobium, molybdenum, tellurium, ruthenium, rhodium, palladium, hafnium, tantalum, tungsten, rhenium, osmium, iridium, platinum, and gold, or the nitrides thereof. A thickness of the metallic layer is preferably 300 nm or less, and more preferable is 100 nm or less. When the thickness exceeds 300 nm, flatness in the surface is damaged at the time of heat-treatment, resulting in difficulty to flatten III-nitride semiconductor layer to be grown thereon. The lower limit of the thickness is not specified, but 1 nm or thicker is desirable.

III-nitride semiconductor layer and a metallic layer are grown on a void-formation preventive layer, and thereafter, when they are heat-treated, micropores appear in the metallic layer. Elements such as nitrogen produced by decomposition of crystalline structures of the III-nitride semiconductor layer evaporate through the micropores, whereby voids are formed in the III-nitride semiconductor layer. The heat treatment is desirably carried out in a hydrogen gas or a hydrogen-containing compound gas atmosphere. An example of the hydrogen-containing compound gas includes ammonia, hydrazine, amines, hydrochloric acid, dichlorosilane, and the like. It is preferred that the heat-treatment is implemented in a mixed gas atmosphere consisting of hydrogen gas and a hydrogen-containing compound gas, and particularly a mixed gas of hydrogen and ammonia is preferable. Thus, a desirable void ratio can be stably realized. A temperature of the heat treatment is preferably 700° C. or higher, and more preferable is 800° C. or higher. Too low temperature results in insufficient formation of voids. The upper limit of the temperature differs dependent upon III-nitride semiconductors to be used, but 1400° C. or lower is desirable in GaN materials.

III-nitride semiconductor is epitaxially grown on the porous substrate prepared as described above. After the epitaxial growth, when the III-nitride semiconductor substrate is exfoliated with the boundary porous III-nitride semiconductor layer, III-nitride semiconductor substrate having a low dislocation density and little warp can be obtained.

EXAMPLE 1

As shown in FIG. 1A, a first GaN layer 4 of an underlying layer having 2 μm thickness, an $Al_xGa_{1-x}N$ (x=0.05) layer 3 of a void-formation preventive layer having 50 nm thickness, and a second GaN layer 2 having 300 nm thickness were sequentially grown on a monocrystalline C-face sapphire substrate 5 of a base material having two inch diameter by means of MOVPE technique. In this case, raw materials were TMGa, TMAl, and $NH_3$. The second GaN layer 2 had $1 \times 10^8$ cm$^{-2}$ dislocation density and ±5% film thickness distribution, so that a low-dislocation-density and uniform film was obtained. A Ti layer 1 having 20 nm thickness was grown on the second GaN layer by means of vacuum evaporation, and then heat-treated in a mixed gas stream of hydrogen and ammonia.

As a result, as shown in FIG. 1B, a porous substrate 6 wherein the Ti layer 1 is modified to a porous TiN layer 1' having a number of micropores, and the second GaN layer 2 is modified to a porous GaN layer 2' containing a number of voids was obtained. Since the AlGaN layer 3 is hardly etched in comparison with the GaN layer 2, formation of voids was prevented by the AlGaN layer 3, so that voids were not produced in the first GaN layer 4. In other words, voids appeared homogeneously in only the second GaN layer 2.

EXAMPLE 2

Figure 2B:
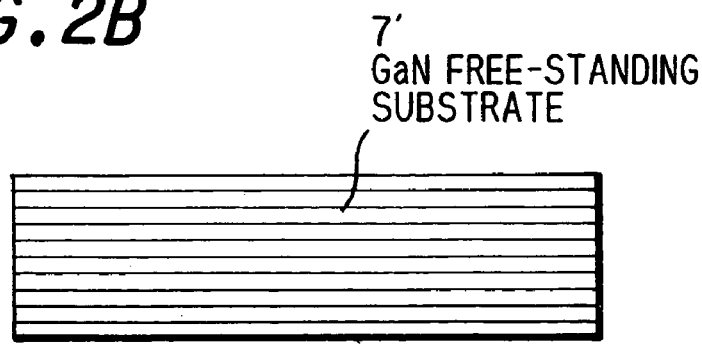
FIG. 2B is an explanatory view of the embodiment of the present invention illustrating the resulting free-standing substrate according to the example 2.

A GaN layer 7 having 300 μm thickness was epitaxially grown on the porous substrate 6 prepared in Example 1 by means of HVPE technique as shown in FIG. 2A. In this case, raw materials were GaCl and $NH_3$, and a growth temperature was 1070° C. The resulting HVPE-GaN layer 7 was exfoliated without accompanying any crack after the growth and after the cooling thereof to obtain a GaN free-standing substrate 7' as shown in FIG. 2B wherein the surface of the substrate is mirror surface and no pit is observed. The result may be considered due to the fact that an underlying crystal (the second GaN layer 2) was thin, so that shallow voids were homogeneously formed. A dislocation density of the GaN free-standing substrate 7' was $1 \times 10^6$ cm$^{-2}$ being uniform in a plane, and a curvature radius thereof was ten meters. It is considered that results of a homogeneous low-dislocation-density and little warp are derived from the fact that the underlying crystal (the first GaN layer 4) was homogeneous and had a low-dislocation-density.

EXAMPLE 3

Figure 3A:
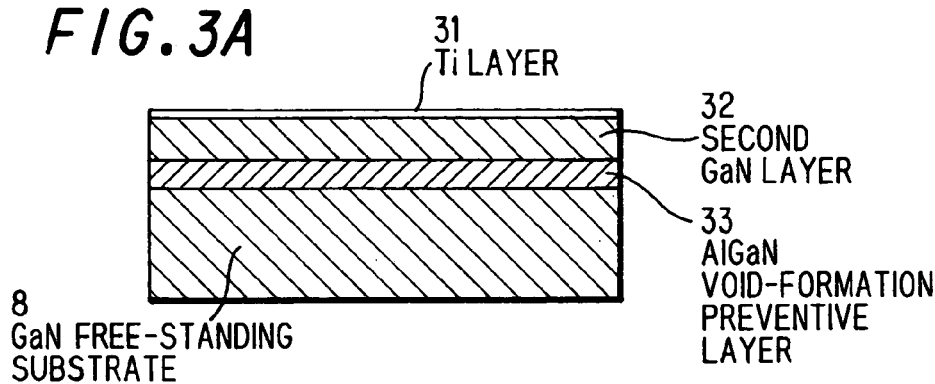
FIG. 3A is an explanatory view of the embodiment of the present invention illustrating processes for embodying example 3.

As shown in FIG. 3A, a GaN free-standing substrate 8 having two inch diameter served both for a base material and an underlying layer was used. An AlGaN layer 33 having 20 nm thickness being a void-formation preventive layer and a GaN layer 32 having 300 nm thickness were sequentially grown on the GaN free-standing substrate 8 by means of MOVPE technique. A Ti layer 31 having 40 nm thickness was grown on the void-formation preventive layer by means of vacuum evaporation. The resulting substrate was heat-treated in a mixed gas stream of $H_2:NH_3=4:1$ at 1050° C. for thirty minutes.

Figure 3B:
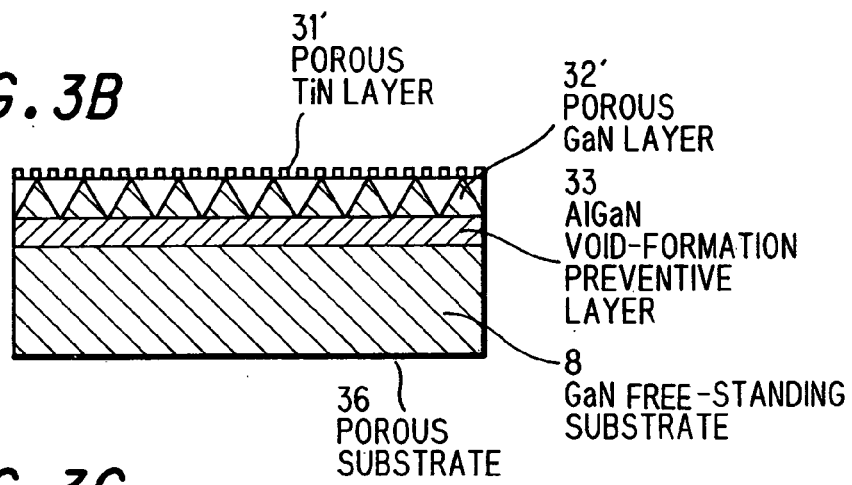
FIG. 3B is an explanatory view of the embodiment of the present invention illustrating processes for embodying example 3.

As a result, a porous substrate 36 wherein the Ti layer 31 is modified to a porous TiN layer 31' having a number of micropores each having 20 nm to 30 nm diameter, and the second GaN layer 32 is modified to a porous GaN layer 32' containing a number of voids was obtained as shown in FIG. 3B. Formation of voids was prevented by the AlGaN layer 33, and no void appeared in the AlGaN layer 33 and the GaN free-standing substrate 8.

Figure 3C:
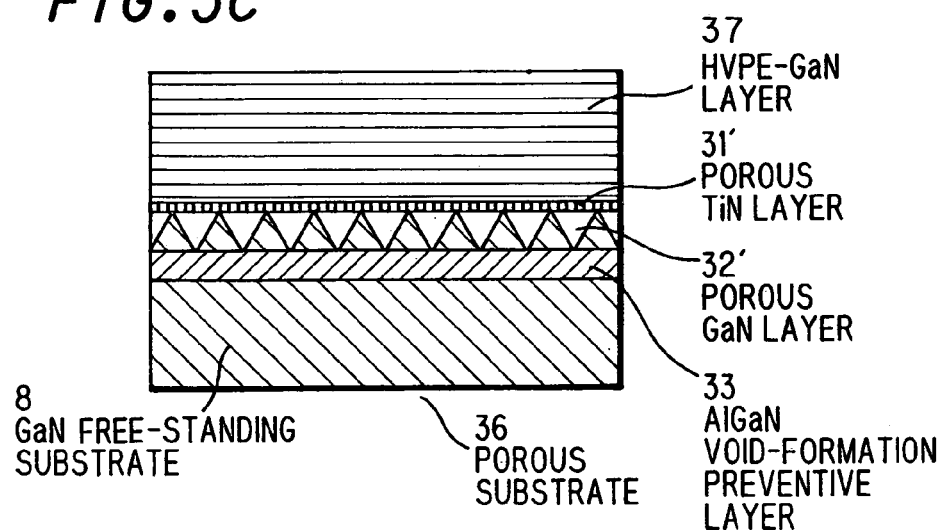
FIG. 3C is an explanatory view of the embodiment of the present invention illustrating processes for embodying example 3.
Figure 3D:
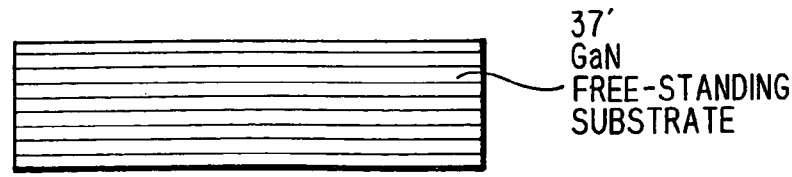
FIG. 3D is an explanatory view of the embodiment of the present invention illustrating the resulting free-standing substrate according to the example 3.

As shown in FIG. 3C, a GaN layer 37 having 300 μm thickness was epitaxially grown by means of HVPE technique on the porous substrate 36 which was heat-treated. In this case, raw materials were GaCl and $NH_3$, and a growth temperature was 1070° C. The resulting HVPE-GaN layer 37 was exfoliated without accompanying any crack after the growth and after the cooling thereof to obtain a GaN free-standing substrate 37' as shown in FIG. 3D wherein the surface of the substrate is mirror surface and no pit is observed. The result may be considered to be based on the fact that the underlying crystal was thin, so that shallow voids were homogeneously formed. A dislocation density of the GaN free-standing substrate 37' was $3 \times 10^5$ cm$^{-2}$ being uniform in plane, and a curvature radius thereof was twenty meters. A crystal having a lower-dislocation-density and lesser warp than those of Example 2 was obtained. Such result is considered to be derived from the fact that the GaN free-standing substrate 8 of a low-dislocation-density was used as an underlying crystal.

EXAMPLE 4

Figure 4A:
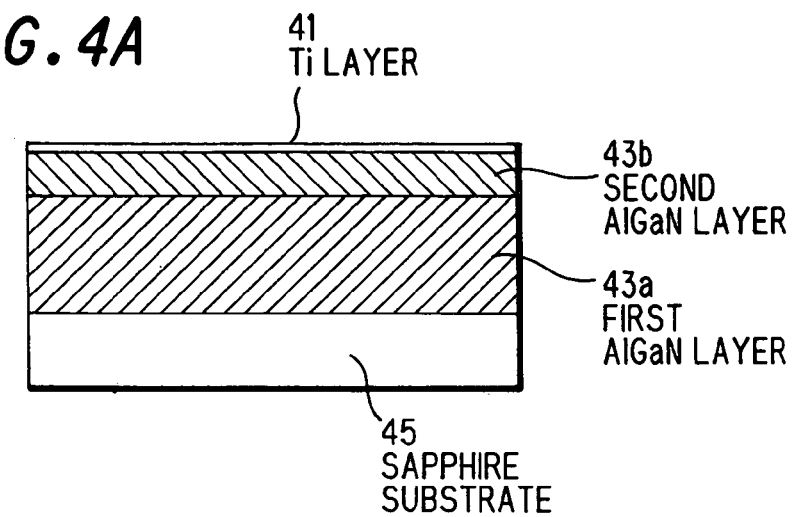
FIG. 4A is an explanatory view of the embodiment of the present invention illustrating processes for embodying example 4.

As shown in FIG. 4A, a first $Al_xGa_{1-x}N$ (x=0.05) layer 43a served for both an underlying layer and a void-formation preventive layer having 1 μm thickness, and a second $Al_yGa_{1-y}N$ (y=0.01) layer 43b having 300 nm thickness were sequentially grown on a monocrystalline C-face sapphire substrate 45 of a base material having two inch diameter by means of MOVPE technique. In this case, raw materials were TMGa, TMAl, and $NH_3$. A Ti layer 41 having 20 nm thickness was grown on the second $Al_yGa_{1-y}N$ layer by means of vacuum evaporation, and then heat-treated in a mixed gas stream of $H_2:NH_3=4:1$ at 1050° C. for thirty minutes.

Figure 4B:
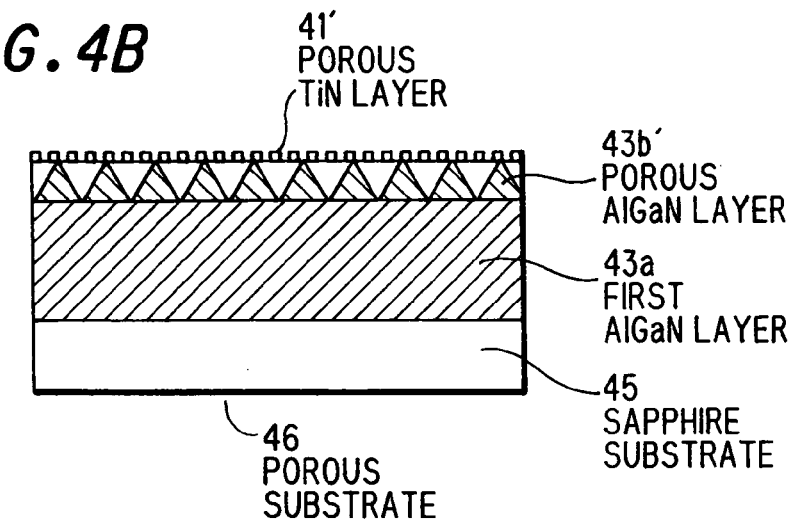
FIG. 4B is an explanatory view of the embodiment of the present invention illustrating processes for embodying example 4.

As a result, as shown in FIG. 4B, a porous substrate 46 wherein the Ti layer 41 is modified to a porous TiN layer 41' having a number of micropores each having 20 to 30 nm diameter, and the second AlGaN layer 43b is modified to a porous AlGaN layer 43b' containing a number of voids was obtained. The first AlGaN layer 43a contains a higher Al composition as compared with that of the second AlGaN layer 43b, so that the first AlGaN layer 43a is hardly etched. As a result, voids were not produced in the first AlGaN layer 43a. In other words, shallow voids appeared homogeneously in a plane in only the second AlGaN layer 43b.

Figure 4C:
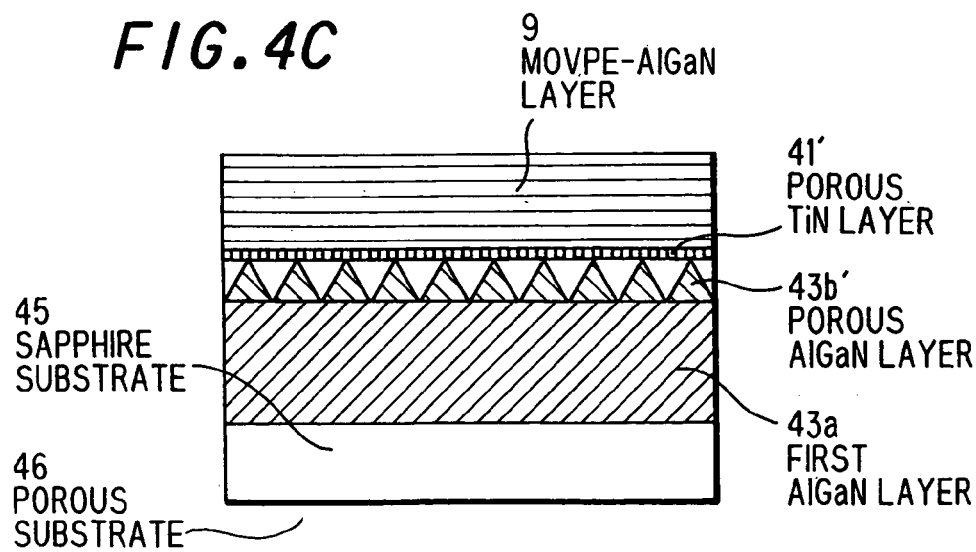
FIG. 4C is an explanatory view of the embodiment of the present invention illustrating the resulting porous substrate according to the example 4.

An undoped $Al_xGa_{1-z}N$ (z=0.01) layer 9 having 2 μm thickness was epitaxially grown on the porous substrate 46 which was heat-treated as shown in FIG. 4C. The resulting AlGaN layer 9 had a mirror surface, and no crack appeared. A dislocation density of the layer 9 was $5 \times 10^6$ cm$^{-2}$ being uniform in a plane, and thus, AlGaN having a low dislocation density was obtained. Furthermore, a curvature radius of the epitaxial substrate was ten meters, and warp was suppressed in the substrate.

EXAMPLE 5

Figure 5A:
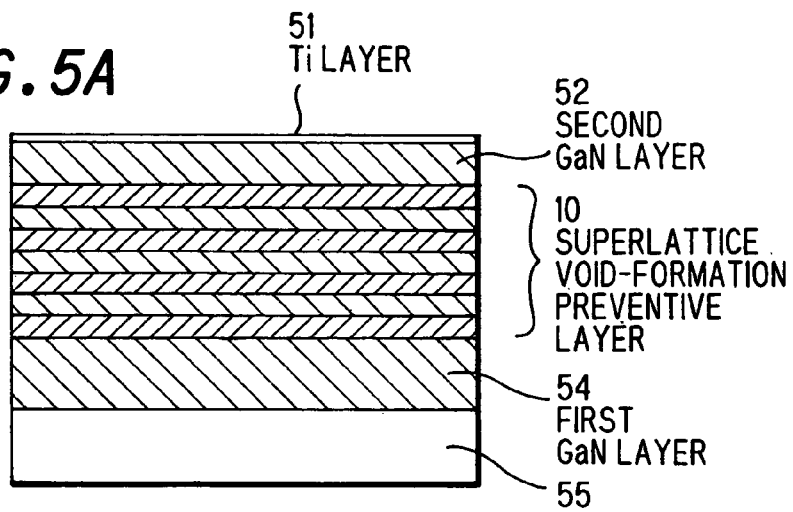
FIG. 5A is an explanatory view of the embodiment of the present invention illustrating processes for embodying example 5.

As shown in FIG. 5A, a first undoped GaN layer 54 of an underlying layer having 2 μm thickness was grown on a monocrystalline C-face sapphire substrate 55 of a base material having two inch diameter by means of MOVPE technique. Twenty pairs of an $Al_xGa_{1-x}N$ (x=0.03) layer having 10 nm thickness and an $Al_yGa_{1-y}N$ (y=0.01) layer having 15 nm thickness were alternately grown on the first GaN layer 54 to form a superlattice void preventive layer 10. Furthermore, a second an undoped GaN layer 52 having 200 nm thickness was grown on the superlattice void preventive layer 10. In this case, raw materials were TMGa, TMAl, and $NH_3$. A Ti layer 51 having 20 nm thickness was grown on the second GaN layer 54 by means of vacuum evaporation, and the resulting substrate was heat-treated in a mixed gas stream of $H_2:NH_3=4:1$ at 1050° C. for thirty minutes.

Figure 5B:
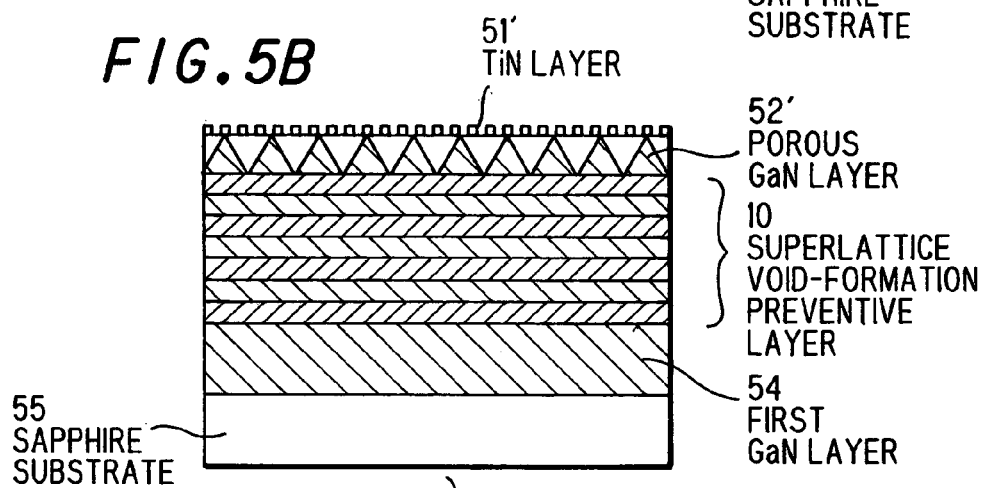
FIG. 5B is an explanatory view of the embodiment of the present invention illustrating processes for embodying example 5.

As a result, as shown in FIG. 5B, a porous substrate 56 wherein the Ti layer 51 is modified to a porous TiN layer 51' having a number of micropores each having 20 to 30 nm diameter, and the second GaN layer 52 is modified to a porous GaN layer 52' containing a number of voids was obtained. The superlattice void-formation preventive layer 10 is composed of AlGaN, so that it is hardly etched. Thus, no void was produced below the superlattice void-formation preventive layer 10. In other words, shallow voids appeared uniform in a plane in only the second GaN layer 52.

Figure 5C:
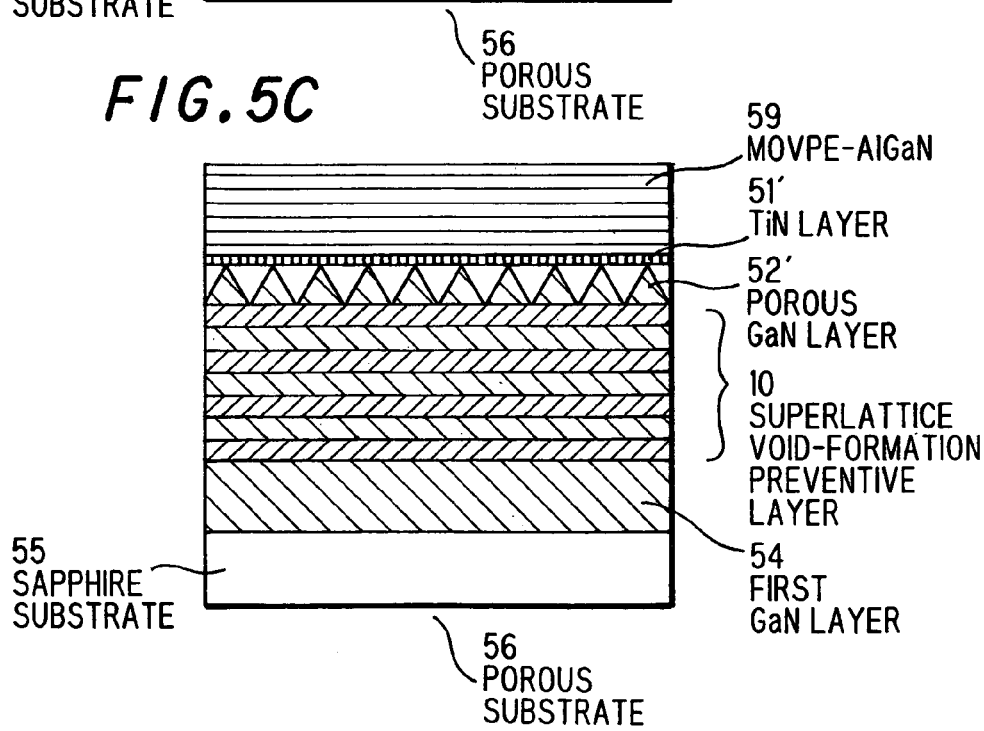
FIG. 5C is an explanatory view of the embodiment of the present invention illustrating the resulting porous substrate according to the example 5.

An undoped $Al_zGa_{1-z}N$ (z=0.01) layer 59 having 2 µm was epitaxially grown by means of MOVPE technique on the porous substrate 56 which was heat-treated as shown in FIG. 5C. The resulting epitaxial layer 59 had a mirror surface, and no crack appeared. A dislocation density of the epitaxial layer 59 was $1 \times 10^6$ cm$^{-2}$ being uniform in a plane, and hence, AlGaN having lower dislocation density than that of Example 4 was obtained. Further, a curvature radius of the epitaxial substrate was fifteen meters, and warp was also suppressed in the substrate.

Conventional Example 1

An undoped GaN layer of an underlying layer having 300 nm thickness was grown on a monocrystalline C-face sapphire substrate of a base material having two inch diameter by means of MOVPE technique. In this case, raw materials were TMGa and $NH_3$. The resulting GaN layer had $1 \times 10^{10}$ cm$^{-2}$ dislocation density and ±15% film thickness distribution. Pits and irregular growth were observed in the GaN layer. A Ti layer having 20 nm thickness was grown on the GaN layer by means of vacuum evaporation, and heat-treated in a mixed gas stream of $H_2:NH_3=4:1$ at 1050° C. for thirty minutes.

As a result, a porous substrate wherein the Ti layer is modified to a porous TiN layer having a number of micropores each having 20 to 30 nm diameter, and the GaN layer is modified to a porous GaN layer containing a number of voids was obtained. However, voids were nonuniform in a plane because of the heterogeneous GaN layer, and a scattering void ratio of 30 to 70% was obtained.

Another GaN layer having 300 µm thickness was grown by means of HVPE technique on the porous substrate which was heat-treated. In this case, raw materials were GaCl and $NH_3$, and a growth temperature was 1070° C. The resulting HVPE-GaN layer was exfoliated from the porous substrate after the growth and its cooling treatment to obtain a GaN free-standing substrate. However, since voids were heterogeneously formed, cracks appeared. A curvature radius of the GaN substrate where no crack was observed was about five meters. Furthermore, materials were not uniformly flattened and there were belatedly flattened portions, so that a region containing a number of pits was also observed. Besides, nonuniform dislocation densities existed, and they scattered over a range of $1 \times 10^7$ to $3 \times 10^7$ cm$^{-2}$.

Conventional Example 2

An undoped GaN layer of an underlying layer having 3 µm thickness was grown on a monocrystalline C-face sapphire substrate of a base material having two inch diameter by means of MOVPE technique. In this case, raw materials were TMGa and $NH_3$. The resulting GaN layer had $1 \times 10^8$ cm$^{-2}$ dislocation density and ±15% film thickness distribution. Surface flatness of the GaN layer was good. A Ti layer having 20 nm thickness was grown on the GaN layer by means of vacuum evaporation, and heat-treated in a mixed gas stream of $H_2:NH_3=4:1$ at 1050° C. for thirty minutes.

As a result, a porous substrate wherein the Ti layer is modified to a porous TiN layer having a number of micropores each having 20 to 30 nm diameter, and the GaN layer is modified to a porous GaN layer containing a number of voids was obtained. A number of voids were formed homogeneously in the GaN layer. However, since the GaN layer was thick, each void had a very deep depth as deep as about 3 µm.

Another GaN layer having 300 µm thickness was grown by means of HVPE technique on the porous substrate which was heat-treated. In this case, raw materials were GaCl and $NH_3$, and a growth temperature was 1070° C. The resulting HVPE-GaN layer was exfoliated from the porous substrate after the growth and its cooling treatment without accompanying any crack to obtain a GaN free-standing substrate. However, belatedly flattened portions appeared, resulting in a number of pits on the surface because of existence of deep voids, and finally a mirror surface could not be obtained.

As described above, the present invention provides a porous substrate for epitaxial growth comprising an underlying layer of III-nitride semiconductor, a void-formation preventive layer grown on the underlying layer, a porous III-nitride semiconductor layer grown on the void-formation preventive layer, and a porous metallic layer grown on the porous III-nitride semiconductor layer. As a result, a porous substrate on which epitaxial crystal growth with a low dislocation density is possible is realized in good reproducibility. Particularly, the porous substrate according to the present invention is effective when it is applied for GaN compound crystal growth, so that an epitaxial growth wafer having a low dislocation density can be obtained. Thus, when a light emitting diode (LED), a laser diode (LD) or the like is manufactured on such epitaxial growth wafer, an optical device of a high power and high reliability can be realized.

Furthermore, the present invention provides a method for manufacturing a porous substrate for epitaxial growth comprising the steps of growing a void-formation preventive layer on an underlying layer made of III-nitride semiconductor, growing III-nitride semiconductor layer on the void-formation preventive layer, growing a metallic layer on the III-nitride semiconductor layer, and forming voids in the III-nitride semiconductor layer and the metallic layer grown on the void-formation preventive layer.

Thus, it is possible to manufacture easily a porous substrate on which epitaxial crystal growth having a low dislocation density can be made in good reproducibility.

Moreover, the present invention provides a method for manufacturing III-nitride semiconductor substrate comprising the steps of growing a void-formation preventive layer on an underlying layer made of III-nitride semiconductor, growing III-nitride semiconductor layer on the void-formation preventive layer, growing a metallic layer on the III-nitride semiconductor layer, forming voids in the III-nitride semiconductor layer and the metallic layer grown on the void-formation preventive layer, epitaxially growing III-nitride semiconductor on the metallic layer in which voids are formed, and exfoliating III-nitride semiconductor substrate from the metallic layer. As a result, an epitaxial growth wafer having a low dislocation density can be obtained. Thus, when a light emitting diode (LED), a laser diode (LD) or the like is manufactured on such epitaxial growth wafer, an optical device having a high power and high reliability can be realized.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A porous substrate for epitaxial growth, comprising:
an underlying layer made of III-nitride semiconductor;
a void-formation preventive layer grown on the underlying layer;
a porous III-nitride semiconductor layer; and
a porous metallic layer grown on the porous III-nitride semiconductor layer.

2. The porous substrate for epitaxial growth as defined in claim 1, wherein:
the underlying layer made of III-nitride semiconductor is a GaN free-standing substrate.

3. The porous substrate for epitaxial growth as defined in claim 1, wherein:
the underlying layer made of III-nitride semiconductor is grown on a base material.

4. The porous substrate for epitaxial growth as defined in claim 1, wherein:
a thickness of the underlying layer made of III-nitride semiconductor is 300 nm or more.

5. The porous substrate for epitaxial growth as defined in claim 3, wherein:
the base material is prepared from at least one material selected from the group consisting of sapphire, silicon, silicon carbide, langasite, zirconium diboride, and gallium arsenide.

6. The porous substrate for epitaxial growth as defined in claim 1, wherein:
the III-nitride semiconductor is prepared from at least one material selected from the group consisting of GaN, AlGaN, InGaN, and InAlGaN.

7. The porous substrate for epitaxial growth as defined in claim 1, wherein:
the void-formation preventive layer has less than 6% lattice constant difference with respect to that of the underlying layer.

8. The porous substrate for epitaxial growth as defined in claim 7, wherein:
the void-formation preventive layer is prepared from AlGaN.

9. The porous substrate for epitaxial growth as defined in claim 1, wherein:
the void-formation preventive layer is a superlattice structure composed of alternately grown plural pairs of an $Al_xGa_{1-x}N$ ($0<x\leq0.5$) layer and an $Al_yGa_{1-y}N$ ($0\leq y<x$) layer.

10. The porous substrate for epitaxial growth as defined in claim 1, wherein:
a thickness of the void-formation preventive layer is 3 nm or more.

11. The porous substrate for epitaxial growth as defined in claim 1, wherein:
a thickness of the porous III-nitride semiconductor layer is 3 μm or less.

12. The porous substrate for epitaxial growth as defined in claim 1, wherein:
the porous metallic layer is prepared from at least one material selected from the group consisting of titanium, vanadium, chromium, manganese, iron, cobalt, nickel, copper, yttrium, zirconium, niobium, molybdenum, tellurium, ruthenium, rhodium, palladium, hafnium, tantalum, tungsten, rhenium, osmium, iridium, platinum, and gold, or the nitrides thereof.

13. A porous substrate for epitaxial growth, comprising:
a sapphire substrate;
a GaN layer grown on the sapphire substrate;
an AlGaN layer grown on the GaN layer;
a porous GaN layer grown on the AlGaN layer; and
a porous TiN layer.

14. A method for manufacturing a porous substrate for epitaxial growth, comprising the steps of:
growing a void-formation preventive layer on an underlying layer made of III-nitride semiconductor;
growing III-nitride semiconductor layer on the void-formation preventive layer;
growing a metallic layer on the III-nitride semiconductor layer; and
forming voids in the III-nitride semiconductor layer and the metallic layer grown on the void-formation preventive layer.

15. The method for manufacturing a porous substrate for epitaxial growth as defined in claim 14, wherein:
the underlying layer prepared from the III-nitride semiconductor is a GaN free-standing substrate.

16. The method for manufacturing a porous substrate for epitaxial growth as defined in claim 14, further comprising the step of:
growing the underlying layer made of the III-nitride semiconductor on a base material.

17. The method for manufacturing a porous substrate for epitaxial growth as defined in claim 16, wherein:
the base material is prepared from at least one material selected from the group consisting of sapphire, silicon, silicon carbide, langasite, zirconium diboride, and gallium arsenide.

18. The method for manufacturing a porous substrate for epitaxial growth as defined in claim 14, wherein:
the III-nitride semiconductor is prepared from at least one material selected from the group consisting of GaN, AlGaN, InGaN, and InAlGaN.

19. The method for manufacturing a porous substrate for epitaxial growth as defined in claim 14, wherein:
the void-formation preventive layer is made of AlGaN or a metallic nitride having a lattice constant close to that of the underlying layer.

20. The method for manufacturing a porous substrate for epitaxial growth as defined in claim 14, wherein:
the void-formation preventive layer is a superlattice structure composed of alternately grown plural pairs of an $Al_xGa_{1-x}N$ ($0<x\leq0.5$) layer and an $Al_yGa_{1-y}N$ ($0\leq y<x$) layer.

21. The method for manufacturing a porous substrate for epitaxial growth as defined in claim 14, wherein:
the metallic porous layer is made of at least one material selected from the group consisting of titanium, vanadium, chromium, manganese, iron, cobalt, nickel, copper, yttrium, zirconium, niobium, molybdenum, tellurium, ruthenium, rhodium, palladium, hafnium, tantalum, tungsten, rhenium, osmium, iridium, platinum, and gold, or the nitrides thereof.

22. The method for manufacturing a porous substrate for epitaxial growth as defined in claim 14, further comprising the step of:

forming voids in the III-nitride semiconductor layer and the metallic layer grown on the void-formation preventive layer by means of the heat treatment.

23. The method for manufacturing a porous substrate for epitaxial growth as defined in claim 22, wherein:
the heat treatment is implemented in an atmosphere containing hydrogen gas or a hydride gas.

24. A method for manufacturing a porous substrate for epitaxial growth, comprising the steps of:
growing a first GaN layer on a sapphire substrate;
growing an AlGaN layer on the first GaN layer;
growing a second GaN layer on the AlGaN layer;
growing a Ti layer on the second GaN layer; and
heat-treating the second GaN layer and the Ti layer in a mixed gas atmosphere of hydrogen gas and a hydride gas to form voids in the second GaN layer and the Ti layer.

25. A method for manufacturing III-nitride semiconductor substrate, comprising the steps of:
growing a void-formation preventive layer on an underlying layer made of III-nitride semiconductor;
growing III-nitride semiconductor layer on the void-formation preventive layer;
growing a metallic layer on the III-nitride semiconductor layer;
forming voids in the III-nitride semiconductor layer and the metallic layer grown on the void-formation preventive layer;
epitaxially growing III-nitride semiconductor substrate on the metallic layer in which voids are formed; and
exfoliating the III-nitride semiconductor substrate from the metallic layer.

26. The method for manufacturing III-nitride semiconductor substrate as defined in claim 25, wherein:
the underlying layer made of the III-nitride semiconductor is a GaN free-standing substrate.

27. The method for manufacturing III-nitride semiconductor substrate as defined in claim 25, further comprising the step of:
growing the underlying layer made of the III-nitride semiconductor on a base material.

28. The method for manufacturing III-nitride semiconductor substrate as defined in claim 27, wherein:
the base material is prepared from at least one material selected from the group consisting of sapphire, silicon, silicon carbide, langasite, zirconium diboride, and gallium arsenide.

29. The method for manufacturing III-nitride semiconductor substrate as defined in claim 25, wherein:
the III-nitride semiconductor is prepared from at least one material selected from the group consisting of GaN, AlGaN, InGaN, and InAlGaN.

30. The method for manufacturing III-nitride semiconductor substrate as defined in claim 25, wherein:
the void-formation preventive layer is made of AlGaN or a metallic nitride having a lattice constant close to that of the underlying layer.

31. The method for manufacturing III-nitride semiconductor substrate as defined in claim 25, wherein:
the void-formation preventive layer is a superlattice structure composed of alternately grown plural pairs of an $Al_xGa_{1-x}N$ ($0<x\leq0.5$) layer and an $Al_yGa_{1-y}N$ ($0\leq y<x$) layer.

32. The method for manufacturing III-nitride semiconductor substrate as defined in claim 25, wherein:
the metallic porous layer is made of at least one material selected from the group consisting of titanium, vanadium, chromium, manganese, iron, cobalt, nickel, copper, yttrium, zirconium, niobium, molybdenum, tellurium, ruthenium, rhodium, palladium, hafnium, tantalum, tungsten, rhenium, osmium, iridium, platinum, and gold, or the nitrides thereof.

33. The method for manufacturing III-nitride semiconductor substrate as defined in claim 25, further comprising the step of:
forming voids in the III-nitride semiconductor layer and the metallic layer grown on the void-formation preventive layer by means of the heat treatment.

34. The method for manufacturing III-nitride semiconductor substrate as defined in claim 33, wherein:
the heat treatment is implemented in an atmosphere containing hydrogen gas or a hydride gas.

35. A method for manufacturing III-nitride semiconductor substrate, comprising the steps of:
growing a first GaN layer on a sapphire substrate;
growing an AlGaN layer on the first GaN layer;
growing a second GaN layer on the AlGaN layer;
growing a Ti layer on the second GaN layer; and
heat-treating the second GaN layer and the Ti layer in a mixed gas atmosphere of hydrogen gas and a hydride gas to form voids in the second GaN layer and the Ti layer;
epitaxially growing a GaN substrate on the Ti layer in which voids are formed; and
exfoliating the GaN substrate from the Ti layer.

* * * * *